(12) United States Patent
Passamani

(10) Patent No.: US 11,984,896 B2
(45) Date of Patent: May 14, 2024

(54) CLOCK ALIGNMENT AND UNINTERRUPTED PHASE CHANGE SYSTEMS AND METHODS

(71) Applicant: Apple Inc., Cupertino, CA (US)

(72) Inventor: Antonio Passamani, Munich (DE)

(73) Assignee: Apple Inc., Cupertino, CA (US)

( * ) Notice: Subject to any disclaimer, the term of this patent is extended or adjusted under 35 U.S.C. 154(b) by 36 days.

(21) Appl. No.: 17/483,563

(22) Filed: Sep. 23, 2021

(65) Prior Publication Data
US 2023/0109641 A1    Apr. 6, 2023

(51) Int. Cl.
| H03K 5/135 | (2006.01) |
| H03K 5/05 | (2006.01) |
| H03K 5/06 | (2006.01) |
| H03M 1/68 | (2006.01) |
| H03M 1/76 | (2006.01) |

(52) U.S. Cl.
CPC .............. *H03K 5/135* (2013.01); *H03K 5/05* (2013.01); *H03K 5/06* (2013.01); *H03M 1/682* (2013.01); *H03M 1/76* (2013.01)

(58) Field of Classification Search
None
See application file for complete search history.

(56) References Cited

U.S. PATENT DOCUMENTS

| 5,758,136 A | 5/1998 | Carlson |
| 6,452,426 B1 | 9/2002 | Tamarapalli et al. |
| 7,245,161 B2 | 7/2007 | Boerstler et al. |
| 8,611,487 B2 | 12/2013 | Wenske |
| 10,623,174 B1 | 4/2020 | Remla et al. |
| 10,840,917 B1 | 11/2020 | Cali et al. |
| 10,972,106 B1 | 4/2021 | Chou et al. |
| 2013/0170591 A1* | 7/2013 | Su .............................. H04L 7/02 375/371 |
| 2019/0089521 A1* | 3/2019 | Coulthard ............. H04L 7/0079 |
| 2023/0068753 A1* | 3/2023 | Bal ........................ H03K 3/037 |

OTHER PUBLICATIONS

Savoj et al.: "A 12-GS/s Phase-Calibrated CMOS Digital-to-Analog Converter for Backplane Communications", IEEE Journal of Solid-State Circuits, vol. 43, No. 5, May 2008, pp. 1207-1216; (XP011208035).
Extended European Search Report for European U.S. Appl. No. 22/190,065 dated Feb. 14, 2023; 12 pgs.

* cited by examiner

*Primary Examiner* — Cassandra F Cox
(74) *Attorney, Agent, or Firm* — FLETCHER YODER PC

(57) ABSTRACT

Clock alignment circuitry may include phase detection circuitry and programmable delay circuitry to facilitate aligning a data signal with a particular state of a clock signal. For example, phase detection circuitry may be disposed at a location of interest to monitor the relative timing of the clock signal and the data signal. Based on the monitored states, the programmable delay circuitry may determine the delay to be applied to the data signal (e.g., prior to propagating through logic operations and transmission to the location of interest) such that the data signal later arrives at the location of interest at a suitable time. Effectively, a programmable delay is added to the delay encountered by the data signal during processing and transmission to the location of interest such that the total delay results in the data signal arriving at the location of interest while the clock signal is in the desired state.

20 Claims, 14 Drawing Sheets

CLOCK ALIGNMENT AND UNINTERRUPTED PHASE CHANGE SYSTEMS AND METHODS

BACKGROUND

This disclosure generally relates to clock alignment and clock phase changes, for example, in a digital-to analog converter (DAC).

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices—including televisions, portable phones, computers, wearable devices, vehicle dashboards, virtual-reality glasses, and more—utilize DACs to generate analog electrical signals from digitally coded data. For example, an electronic device may use one or more DACs to convert digital signals to analog signals for transmission via radio frequency (RF) circuitry. Additionally or alternatively, DACs may be used to drive pixels of an electronic display at specific voltages based on digitally coded image data to produce the specific luminance level outputs to display an image. In some scenarios, the physical and/or logical layout of unit cells within a DAC may alter the data path length to each unit cell and/or the number of circuitry components traversed by the digital signal, which may affect the speed of operation of the DAC and/or the linearity of the DAC. Additionally, it may be difficult to maintain aligned clock signals throughout unit cells of the DAC, especially as the operating frequency is increased. Clock signals may also glitch when the clock phase is changed or the clock is reset while the system is running.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device may include a digital-to-analog converter (DAC) having multiple cells and decoding logic. The decoding logic may be coupled to the cells and cause a time delay to a digital signal received by one of the cells. The electronic device may also include phase detection circuitry including a flip-flop to receive a reference clock signal and the digital signal after the time delay and to output an alignment signal. Additionally, the electronic device may include programmable delay circuitry to receive the alignment signal and delay the digital signal by a programmable delay, before the time delay, based on the alignment signal.

In another embodiment, a method may include receiving, via a loop controller of a clock alignment loop, a first alignment signal indicative of a first timing difference between a reference clock signal and a data signal at a circuit of interest. The method may also include changing, via the loop controller, a programmable time delay of the data signal and receiving a second alignment signal indicative of a second timing difference between the reference clock signal and the data signal based on the programmable time delay. The method may further include comparing the first alignment signal and the second alignment signal as well as determining and maintaining an aligned value of the programmable time delay based on the comparison of the first alignment signal and the second alignment signal. Additionally, the aligned value of the programmable time delay may be indicative of alignment between the reference clock signal and the data signal at the circuit of interest.

In yet another embodiment, an electronic device may include first logic circuitry having a logic input to receive a data signal and a logic output to output a processed data signal. The first logic circuitry may cause a first delay between the logic input and the logic output. The electronic device may also include second logic circuitry to receive the processed data signal and a reference clock signal and to output an alignment signal associated with a relative timing between the reference clock signal and the processed data signal. The electronic device may also include phase select circuitry including a string of buffers to effect a second delay on the data signal based on a number of buffers implemented in the string of buffers. The electronic device may also include a loop controller that selects the number of buffers to implement in the string of buffers based on the alignment signal.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
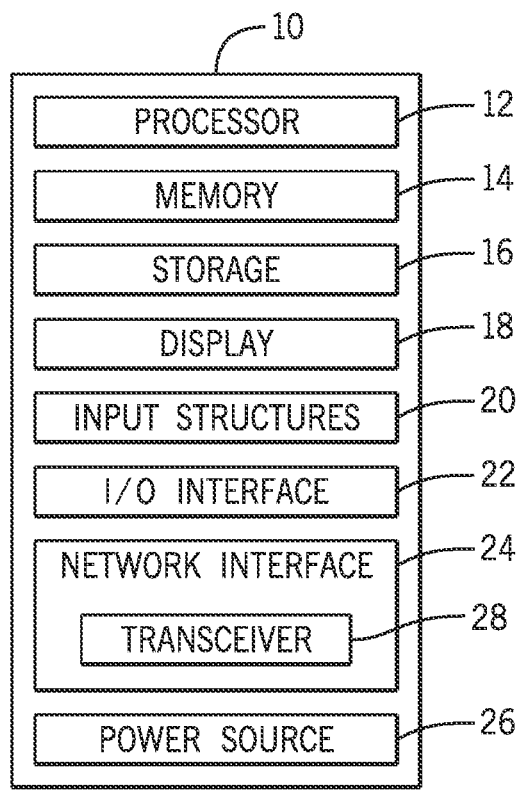
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

An electronic device may use one or more clock signals to regulate operation. For example, a digital-to-analog converter (DAC) may utilize a clock signal to generate analog outputs synchronous with other signals and/or to aid in generation of the analog outputs. In general, DACs are used to convert digitally coded data (e.g., coded via binary code, grey-code, thermometer code, etc.) to a corresponding analog output. A DAC may generate the analog output signal by switching on or activating one or more unit cells that each output a unit level current or voltage that, when aggregated with other unit cells of the DAC, forms the analog electrical signal. In some embodiments, clock signals may be used to synchronize the unit level currents/voltages from the unit cells to form the aggregated analog output signal. As the operating frequency of the DAC increases, the complexity of maintaining synchronous operation may also increase. For example, at increasing operating frequencies, the path lengths and number of circuits traversed by operating signals may generate physical delays that become more significant. Indeed, the physical and/or logical layout of the unit cells may alter the data path length to each unit cell and/or the number of circuitry components traversed by the digital signal, which may affect the speed of operation of the DAC and/or the linearity of the DAC. For example, a column and line DAC may use multiple decision units in parallel to decipher, reprocess, and/or combine digital data to control operation of unit cells to generate an analog signal. However, the logical layout of the column and line decision units, as well as the physical layout of the column and line unit cells, may create varying data path lengths to the unit cells, as well as more complicated and/or slower control logic operation, than that of, for example, a fractal DAC. This may lead to phase delays and/or synchronicity problems when compared to the fractal DAC.

In some embodiments, a fractal arrangement of unit cells and/or the transmission lines thereto into branches may assist in unifying the data path length to each of the unit cells, which may result in increased speed (e.g., operating frequency) of the DAC, increased linearity, better synchronous performance, and/or potential power savings. For example, as opposed to column and line DACs, where the data path to different unit cells may vary, a fractal DAC may have a static path length for the incoming data to each of the unit cells. In other words, each branch of the fractal layout tree may have equal length from the input to the unit cells. As such, there is reduced or minimized waiting between moments when activation signals arrive at the unit cells to be activated for a given data value. Additionally, the simplified distribution (e.g., via sequential decision units) of the incoming data to the unit cells may be further simplified by limiting or eliminating gate cells and/or reprocessing or recombining the data signals, which may further increase speed capabilities (e.g., operating frequency) and/or linearity (e.g., decreased differential nonlinearity (DNL) and/or integral nonlinearity (INL)) of the DAC. Moreover, due to the sequential nature of the decision units governing the unit cells, some signals (e.g., the clock signal, a phase signal, etc.) may be turned off when it is known that no further unit cells will be needed in a particular branch, yielding increased power savings.

During operation, a number of unit cells corresponding to the input digital signal may be simultaneously or concurrently activated to generate the analog output signal, and a clock signal may facilitate the simultaneous or concurrent activation. For example, the unit cells may be activated when the clock signal is logically "high." Furthermore, when the digital signal changes, calling for a different analog output signal, the activation signals may change accordingly. In some scenarios, it may be desirable that the changes to the activation signals occur while the clock signal is logically "low" to avoid potential errors. However, even with increased synchronicity due to the physical layout, such as that of a fractal DAC, it may be desirable to provide a data-clock alignment to ensure the changes to the activation signals occur while the clock signal is logically "low." Moreover, providing a feedback loop to confirm alignment may allow for continuous or period realignment to account for potential changes in operating conditions such as temperature or operating frequency.

Clock alignment circuitry may include phase detection circuitry and programmable delay circuitry to facilitate aligning a data signal (e.g., the activation signals of the unit cells) with a particular state (e.g., logically "low") of a clock signal. For example, phase detection circuitry may be disposed at a location of interest (e.g., one or more unit cells) to monitor the relative timing of the clock signal and the data signal. Based on the monitored states at the unit cell, the programmable delay circuitry may determine a delay amount to be applied to the data signal (e.g., prior to propagating through one or more processing stages and transmission to the location of interest) such that the data signal later arrives at the location of interest (e.g., the monitored unit cell(s)) at a suitable time, such as when the clock signal is logically "low." Effectively, the delay encountered by the data signal during processing and transmission to the location of interest is measured and an additional delay is added such that the total delay results in the data signal arriving at the location of interest while the clock signal is in the desired state (e.g., logically "low"). In some embodiments, the clock alignment circuitry may operate in a looped fashion to constantly or periodically check the relative timing of the clock signal and the data signal at the location of interest and adjust the programmable delay accordingly. For example, the delay associated with the processing and transmission of the data signal may change over time based on environmental (e.g., temperature, humidity, etc.) or operational (e.g., operating frequency, operating mode, voltage level, etc.) changes. Additionally or alternatively, the programmable delay may be updated following changes in the clock signal, such as phase changes or resets.

In some scenarios, changes in the clock signal, such as phase changes or resets, may propagate glitches to circuitry reliant upon the clock signal. As used herein, glitches in the clock signal are shortened clock cycles (e.g., clock pulses) that may cause undesired effects in subsequent circuitry. For example, a glitch in the clock signal may not allow a circuit component to finish operating before the shortened next clock cycle arrives, which may cause an unknown or error state in the circuit component. As such, the presently disclosed clock change circuitry may reduce or eliminate glitches by holding the clock signal in a particular state (e.g., logically low) while the change occurs, and release the clock signal afterwards, effectively skipping or overall reducing potentially glitched clock cycles.

As should be appreciated, while discussed herein in the context of a DAC, embodiments of the present disclosure such as the clock alignment circuitry and the clock change circuitry may be implemented in any suitable scenario for clock alignment or uninterrupted clock changes. Furthermore, while certain aspects are disclosed in relation to a logically "low" or "high" signal values, as should be appreciated, embodiments may operate using complementary or alternative signals utilizing different logical values.

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 20, an input/output (I/O) interface 22, a network interface 24, and a power source 26. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 20, the input/output (I/O) interface 22, the network interface 24, and/or the power source 26 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 20 of the electronic device 10 may enable a user to interact with the electronic device 10 (e.g., pressing a button to increase or decrease a volume level). The I/O interface 22 may enable electronic device 10 to interface with various other electronic devices, as may the network interface 24. In some embodiments, the I/O interface 22 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 24 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 522.11x family of protocols (e.g., WI-FI®), and/or for a wide area network (WAN), such as any standards related to the Third Generation Partnership Project (3GPP), including, for example, a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a satellite network, and so on. In particular, the network interface 24 may include, for example, one or more interfaces for using a Release-15 cellular communication standard of the 5G specifications that include the millimeter wave (mmWave) frequency range (e.g., 22.25-252 gigahertz (GHz)) and/or any other cellular communication standard release (e.g., Release-16, Release-17, any future releases) that define and/or enable frequency ranges used for wireless communication. The network interface 24 of the electronic device 10 may allow communication over the aforementioned networks (e.g., 5G, Wi-Fi, LTE-LAA, and so forth).

The network interface 24 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 24 may include a transceiver 28. In some embodiments, all or portions of the transceiver 28 may be disposed within the processor 12. The transceiver 28 may support transmission and receipt of various wireless signals via one or more antennas, and thus may include a transmitter and a receiver. The power source 26 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
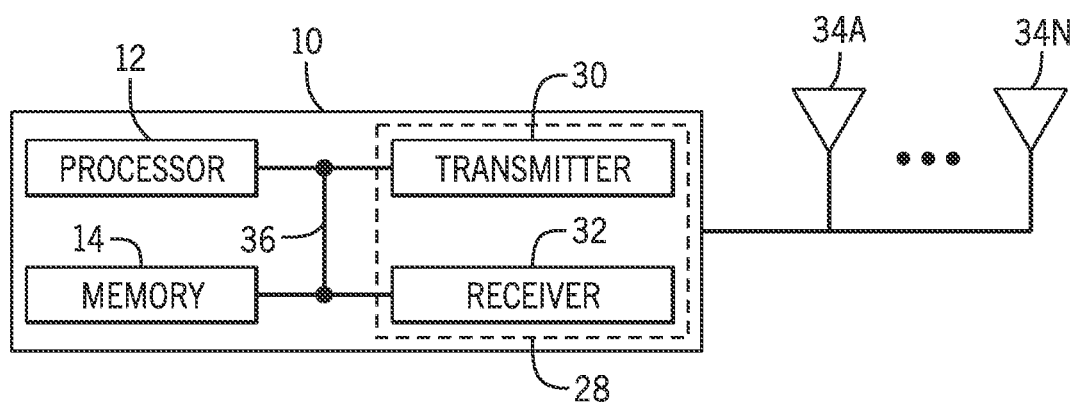
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 28, a transmitter 30, a receiver 32, and/or antennas 34 (illustrated as 34A-34N, collectively referred to as an antenna 34) may be communicatively coupled directly or indirectly (e.g., through or via another component, a communication bus, a network) to one another to transmit and/or receive data between one another.

The electronic device 10 may include the transmitter 30 and/or the receiver 32 that respectively enable transmission and reception of data between the electronic device 10 and an external device via, for example, a network (e.g., including base stations) or a direct connection. As illustrated, the transmitter 30 and the receiver 32 may be combined into the transceiver 28. The electronic device 10 may also have one or more antennas 34A-34N electrically coupled to the transceiver 28. The antennas 34A-34N may be configured in an omnidirectional or directional configuration, in a single-beam, dual-beam, or multi-beam arrangement, and so on. Each antenna 34 may be associated with a one or more beams and various configurations. In some embodiments, multiple antennas of the antennas 34A-34N of an antenna group or module may be communicatively coupled a respective transceiver 28 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 30 and the receiver 32 may transmit and receive information via other wired or wireline systems or means.

As illustrated, the various components of the electronic device 10 may be coupled together by a bus system 36. The bus system 36 may include a data bus, for example, as well as a power bus, a control signal bus, and a status signal bus, in addition to the data bus. The components of the electronic device 10 may be coupled together or accept or provide inputs to each other using some other mechanism.

Figure 3:
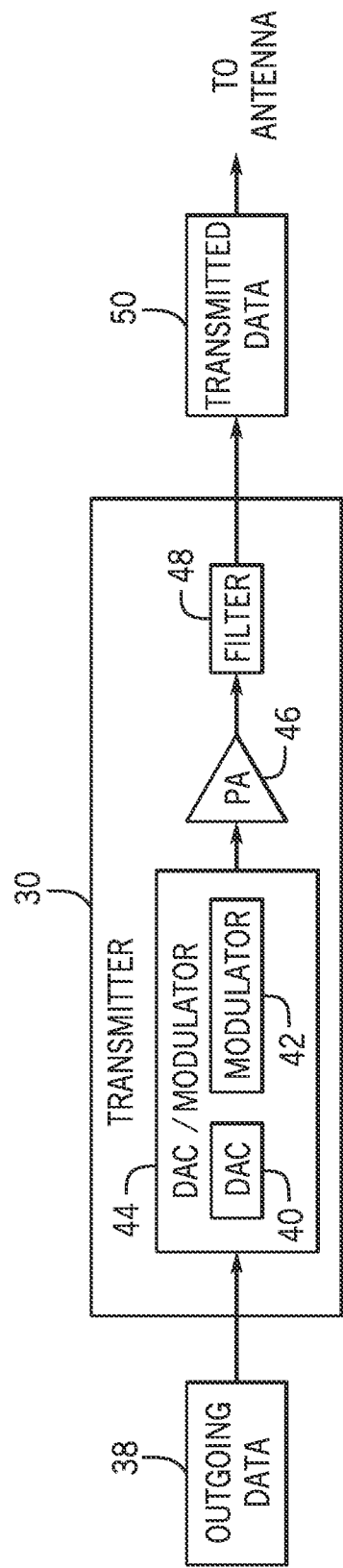
FIG. 3 is a schematic diagram of a transmitter of the electronic device of FIG. 1, according to embodiments of the present disclosure.

FIG. 3 is a schematic diagram of the transmitter 30 (e.g., transmit circuitry), according to embodiments of the present disclosure. As illustrated, the transmitter 30 may receive outgoing data 38 in the form of a digital signal to be transmitted via the one or more antennas 34. A digital-to-analog converter (DAC) 40 of the transmitter 30 may convert the digital signal to an analog signal, and a modulator 42 may combine the converted analog signal with a carrier signal to generate a radio wave. As illustrated, the DAC 40 and modulator 42 may be implemented together in a DAC/modulator 44. For example, the DAC/modulator 44 may convert the digital signal to the analog signal and combine the converted analog signal with the carrier signal simultaneously and/or within the same circuitry. In additional or alternative embodiments, the DAC/modulator 44 may be implemented as multiple circuits (e.g., DAC 40 and modulator 42) coupled together or a singular combined circuit. In some embodiments, the DAC/modulator 44 may directly generate a modulated analog signal without first generating the converted analog signal. Furthermore, as used herein, DAC 40 may refer to a standalone DAC 40 or a combined DAC/modulator 44. Additionally, while embodiments are described herein as applying to RF signal generation, in some embodiments, aspects of the present disclosure may be applicable to other types or utilizations of DACs, such as a baseband DAC.

A power amplifier (PA) 46 receives the modulated signal from the modulator 42. The power amplifier 46 may amplify the modulated signal to a suitable level to drive transmission of the signal via the one or more antennas 34. A filter 48 (e.g., filter circuitry and/or software) of the transmitter 30 may then remove undesirable noise from the amplified signal to generate transmitted data 50 to be transmitted via the one or more antennas 34. The filter 48 may include any suitable filter or filters to remove the undesirable noise from the amplified signal, such as a bandpass filter, a bandstop filter, a low pass filter, a high pass filter, and/or a decimation filter. Additionally, the transmitter 30 may include any suitable additional components not shown, or may not include certain of the illustrated components, such that the transmitter 30 may transmit the outgoing data 38 via the one or more antennas 34. For example, the transmitter 30 may include a mixer and/or a digital up converter. As another example, the transmitter 30 may not include the filter 48 if the power amplifier 46 outputs the amplified signal in or approximately in a desired frequency range (such that filtering of the amplified signal may be unnecessary).

Figure 4:
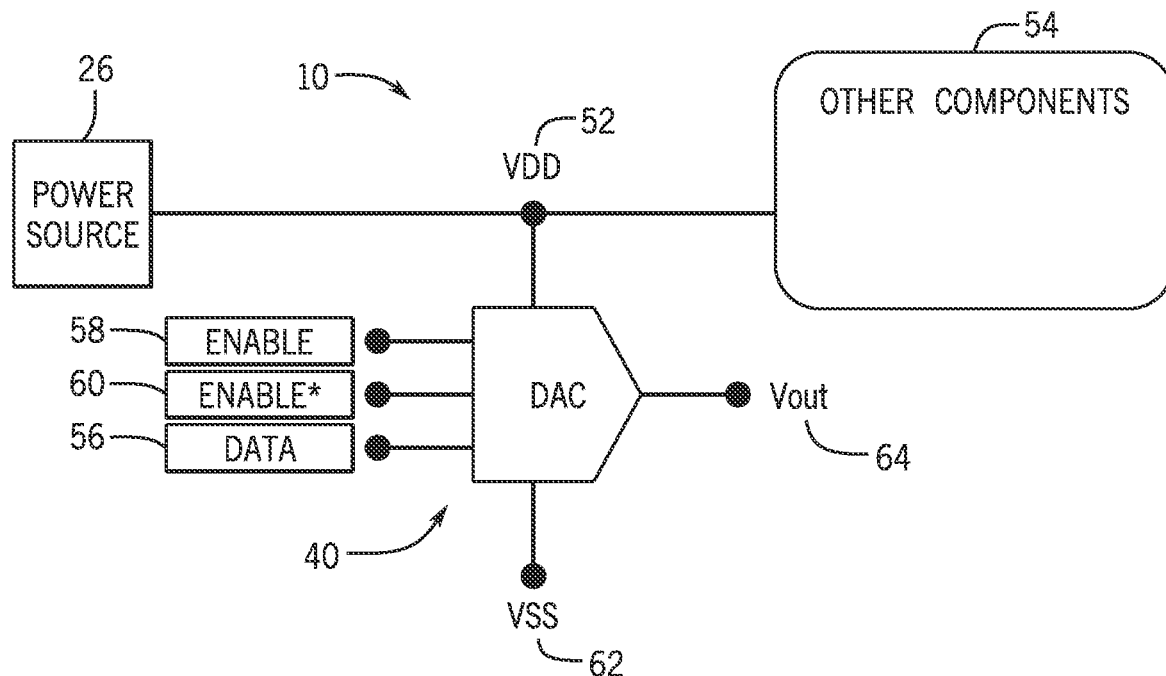
FIG. 4 is a schematic diagram of a portion of the electronic device of FIG. 1 including the digital-to-analog converter of FIG. 3, in accordance with an embodiment of the present disclosure.

FIG. 4 is a schematic diagram of a portion of the electronic device 10 having a DAC 40, according to an embodiment of the present disclosure. In some embodiments, the DAC 40 may share a supply voltage (e.g., VDD) 52 provided by the power source 26 with other components 54 of the electronic device 10. For example, the other components 54 may include any powered electronic component of the electronic device 10 utilizing the supply voltage 52 or a derivative thereof. Moreover, the DAC 40 may receive the digital signal 56 (e.g., of outgoing data 38), an enable signal 58, and/or a complementary enable signal 60. The enable signal 58 and/or the complementary enable signal 60 may enable and/or facilitate enabling operation of the DAC 40. For example, if the enable signal 58 is logically "low" relative to a reference voltage 62 (e.g., ground or other relative voltage), then the DAC 40 may be disabled or inactive. On the other hand, if the enable signal 58 is logically "high" (e.g., relative to the reference voltage 62 and/or the supply voltage 52), then the DAC 40 may be enabled or active for operation. Furthermore, the reference voltage 62 (e.g., VS S) may be provided as a reference for the digital signal 56, the enable signal 58, the complementary enable signal 60, the supply voltage 52, and/or the analog output signal 64. As should be appreciated, and as used herein, signals (e.g., the digital signal 56, the enable signal 58, the complementary enable signal 60, the analog output signal 64, etc.) may correspond to voltages and/or currents relative to a reference (e.g., the reference voltage 62) and may represent electronically storable, displayable, and/or transmittable data.

As discussed herein, the different analog output signals 64 generated by the DAC 40 may correspond to values of the digital signal 56. The digital signal 56 and corresponding analog output signal 64 may be associated with any suitable bit-depth depending on implementation. For example, in the context of image data (e.g., in a baseband DAC) and/or signal transmission data (e.g., in an RF DAC), an 8-bit digital signal 56 may correspond to 255 or 256 analog output signals 64.

Figure 5:
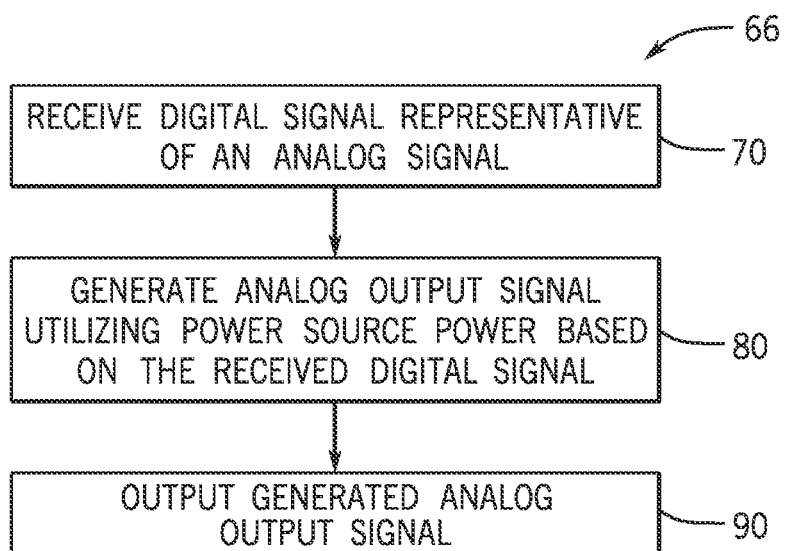
FIG. 5 is a flowchart of a method for converting a digital signal to an analog signal using the digital-to-analog converter of FIG. 4, in accordance with an embodiment of the present disclosure.

FIG. 5 is a flowchart 66 of a method for converting a digital signal to an analog signal using the DAC 40, according to an embodiment of the present disclosure. In general, the DAC 40 may receive a digital signal 56 representative of an analog signal (process block 70). The DAC 40 may also generate an analog output signal 64 (as discussed in further detail below), utilizing power from the power source 26, based on the received digital signal 56 (process block 80). The generated analog output signal 64 may then be output from the DAC 40 (processing block 90).

Figure 6:
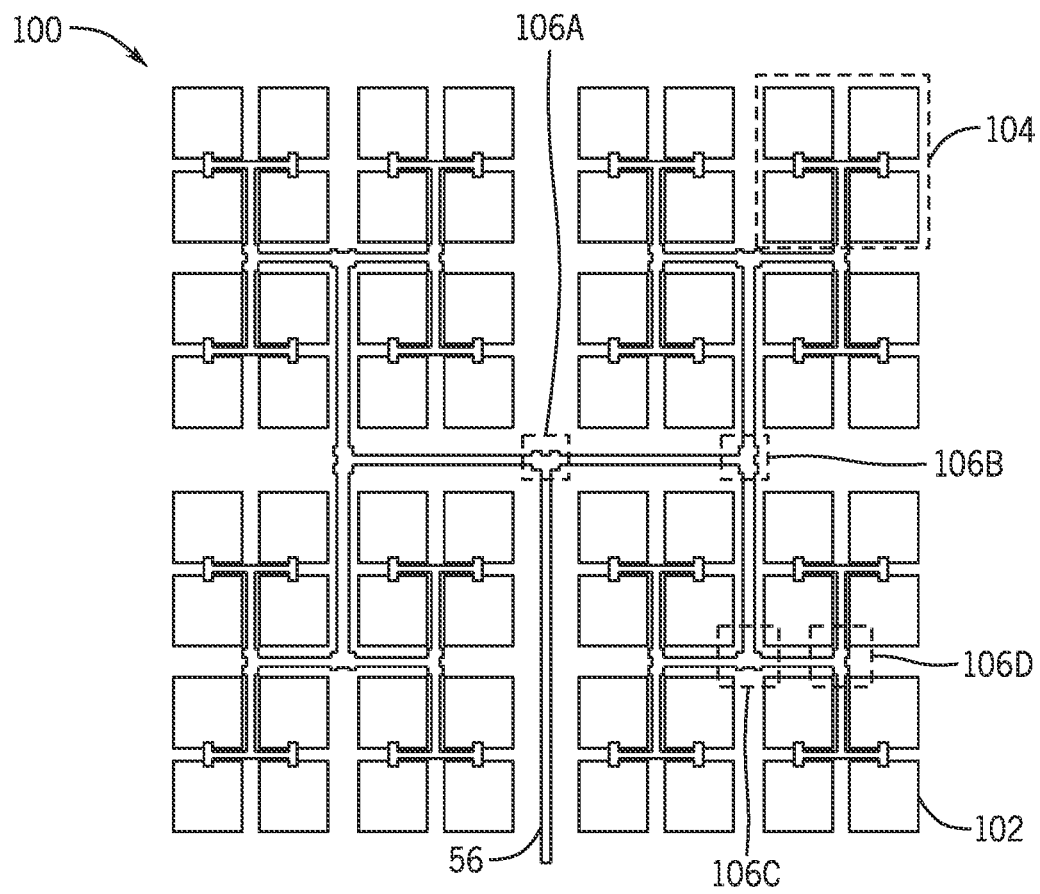
FIG. 6 is a schematic diagram of a fractal digital-to-analog converter, in accordance with an embodiment of the present disclosure.

As discussed above, DACs 40 may generate an analog output signal 64 by enabling one or more unit cells to output a unit amount of current or voltage that, when aggregated with unit amounts of current or voltage output by other unit cells, forms the analog output signal 64. The unit current or voltage may be predetermined and based on implementation factors. For example, the unit cells may include one or more capacitors that store a fixed amount of charge that may be released to form the analog output signal 64. In some scenarios, the physical and/or logical layout of the unit cells may affect the speed of operation of the DAC and/or the linearity of the DAC. As such, in some embodiments, one or more DACs 40 of the electronic device 10 may be implemented as a fractal DAC 100, as illustrated in FIG. 6. A fractal DAC 100 may include multiple unit cells 102 arranged (e.g., logically and/or physically) in a fractal pattern constructed of fractal blocks 104. Moreover, the illustrated pattern may be replicated by replacing each unit cell 102 with a fractal block 104 to realize a fractal DAC of increased size while maintaining symmetry.

In the illustrated example, the fractal DAC 100 includes sixteen fractal blocks 104 of four unit cells 102, which may correspond to, for example, sixty-four different analog output signals 64 (e.g., which may have non-zero values). However, larger fractal DACs may be envisioned by replacing each unit cell 102 with a fractal block 104, increasing the size of the fractal DAC 100 by four each time to maintain $4^x$ unit cells 102 (where x is the number of fractal blocks 104 in the fractal DAC 100). As should be appreciated, the size of the fractal DAC 100 may depend on implementation factors such as desired granularity of the analog output signal 64. Furthermore, different size fractal blocks 104 (e.g., half of a fractal block 104) may be used to achieve different numbers of total unit cells 102 (e.g., $2^x$ number of unit cells 102 for fractal blocks 104 having a size of two unit cells 102). Moreover, in some embodiments, one or more unit cells 102 may be representative of fractional unit cells (e.g., outputting 0.5 or 0.25 of a unit voltage or current) to further increase granularity, dynamic range extension, and/ or as an offset to decrease differential nonlinearity (DNL) and/or integral nonlinearity (INL).

In some embodiments, the multiple nested fractal blocks 104 may be continuously split into symmetrical branches by decision units 106 (e.g., 106A, 106B, 106C, 106D, etc.) until reaching the unit cells 102. That is, for a given branch of the fractal DAC 100, sequential decision units 106 may be used to interpret and decode the digital signal 56 and direct enable/disable signals to the corresponding unit cells 102 to generate the analog output signal 64. Additionally, although the digital signal 56 is depicted as a single line, in some embodiments, the digital signal 56 may include multiple data buses running in parallel through the fractal DAC 100. For example, the multiple data buses may include data for multiple phases and/or polarity (e.g., negative and positive). As such, the fractal DAC 100 and the decision units 106 may operate using multiple digital signals 56 in parallel to control outputs of the unit cells 102.

Figure 7:
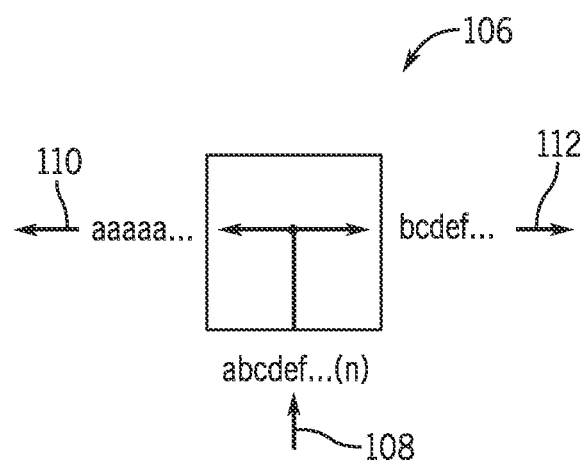
FIG. 7 is a schematic diagram of a decision unit of the fractal digital-to-analog converter of FIG. 6, in accordance with an embodiment of the present disclosure.

To help illustrate, FIG. 7 is an example decision unit 106 receiving an incoming signal 108 of n bits, according to an embodiment of the present disclosure. In some embodiments, the incoming signal 108 (e.g., the digital signal 56) is a binary signal that is decoded step-by-step by the sequential decision units 106, such that the aggregate of the signals reaching the unit cells 102 forms a thermometric signal. For example, the aggregate thermometric signal for a binary incoming signal 108 of "10" may be represented as "0011." As the decision units 106 decipher and pass on certain portions of the incoming signal 108 along different routes, the unit cells 102 may eventually end up with respective portions of the thermometric digital signal (e.g., with logical "1" or high going to two unit cells 102 for activation and logical "0" or low going to two different unit cells 102 for deactivation). For example, the incoming signal 108 may have n-bits (e.g., abcdef . . . , where each letter is representative of a logical value in a binary format, as in the illustrated example). Each decision unit 106 may take the most significant bit (MSb) of the incoming signal 108, repeat it n−1 times, and output a MSb signal 110 having the MSb of the incoming signal 108 repeated n−1 times. Additionally, the decision unit 106 may output a least significant bit (LSb) signal 112 including the remainder of the incoming signal 108, without the MSb, having n−1 total bits. As should be appreciated, the MSb of a binary signal is representative of half of the value of the incoming signal 108. As such, if the MSb (e.g., at decision unit 106A) is a logical "1", the repeated logical "1" will be propagated down half of the branches of the fractal DAC 100, reducing the bit-depth by one with each subsequent decision unit 106, to enable half of the unit cells 102 downstream from the initial decision unit 106 (e.g., decision unit 106A). The remaining half of the unit cells 102 may be enabled or disabled according to the LSb signal 112 having the remainder of the incoming signal 108. Using similar logic, the LSb signal 112 from an initial decision unit 106 (e.g., decision unit 106A) may be the incoming signal 108 for a subsequent decision unit 106 (e.g., decision unit 106B) and so forth.

Additionally, although depicted in FIGS. 6 and 7 as having two outputs (e.g., MSb signal 110 and LSb signal 112), in some embodiments, the decision units 106 may evaluate multiple bits of the incoming signal 108 at the same time. For example, a decision unit 106 may provide four outputs in a quaternary split of the incoming signal 108, effectively combining the efforts of the first two levels of decision units 106 (e.g., decision unit 106A, decision unit 106B, and the decision unit opposite decision unit 106B). In the example of the quaternary split, two outputs may include the MSb signal 110 with a bit depth of n−2, a signal of repeated entries of the second MSb with a bit depth of n−2, and the LSb signal 112 with a bit depth of n−2, having the 2 MSbs removed. As should be appreciated, the number of splits for a single decision unit 106 may vary based on implementation. Furthermore, in some embodiments, the decision units 106 may include multiple incoming signals 108, for example from multiple parallel data buses, and provide either a binary split, a quaternary split, or other split to each incoming signal 108.

As discussed above, the fractal DAC 100 may facilitate decoding of the digital signal 56 (e.g., via the decision units 106) into a thermometric signal dispersed among the unit cells 102. Additionally or alternatively, the digital signal 56 may include a binary signal that is not decoded via the decision units 106. For example, some unit cells 102 may have a binary-sized output that is dependent upon a binary signal. In some embodiments, the binary signal (e.g., a portion of the digital signal 56) may traverse the same path as the decoded thermometric signal and therefore have substantially similar arrival time at the binary coded unit cells 102, maintaining synchronicity of the fractal DAC 100. For example, the binary signal may be passed through or bypass the decision units 106 and/or use separate distribution logic following the data path of the fractal DAC 100. The binary coded unit cells 102 may use the binary signal to vary the output between zero (e.g., disabled) and a full unit voltage or current (e.g., 0.0 or more, 0.25 or more, 0.5 or more, 0.75 or more, or up to 1.0 of a unit voltage or current). For example, the binary coded unit cell 102 may include binary interpretation logic to decode the binary signal and enable the binary coded unit cell 102 at an intermediate power level (e.g., more than 0.0, 0.25 or more, 0.5 or more, or 0.75 or more of a unit voltage or current). The binary-sized output of the binary coded unit cells 102 may facilitate increasing resolution of the analog output signal 64 by providing increased granularity.

Figure 8:
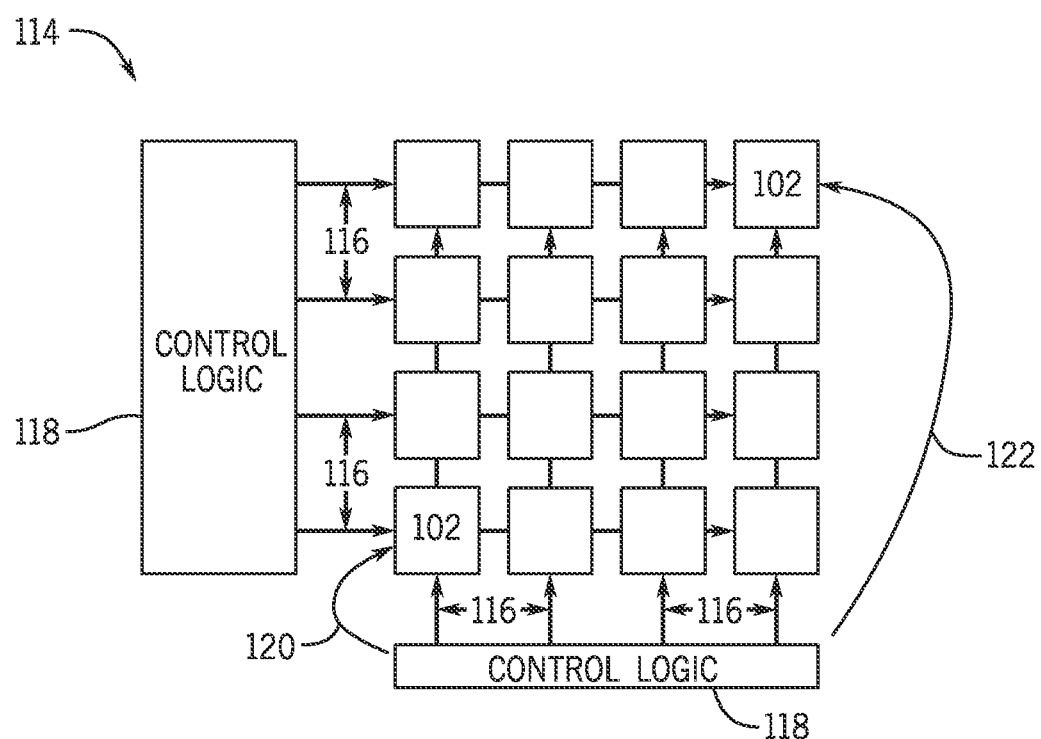
FIG. 8 is a schematic diagram of a column and line digital-to-analog converter, in accordance with an embodiment of the present disclosure.

The fractal DAC 100 may provide increased benefits (e.g., increased speed, increased linearity, decreased DNL, and/or decreased INL) over other forms of DACs such as a column and line DAC 114, as shown in FIG. 8. In some scenarios, the column and line DAC 114 may include a multitude of control signals 116 from control logic 118 feeding an array of unit cells 102. Moreover, while the control logic 118 of the column and line DAC 114 may be non-uniform and have more complex control signals 116, the fractal DAC 100, as discussed herein, may include repeated or reproduced decision units 106 with simplified outputs (e.g., the MSb signal 110 and the LSb signal 112). For example, the control logic 118 of the column and line DAC 114 may incorporate binary to thermometric conversion and/or take into consideration the desired states of multiple individual unit cells 102 concurrently or simultaneously to determine control signals 116 necessary for operation. On the other hand, the simplified decision units 106 may operate faster than control logic 118 of a column and line DAC 114 due to the simplified set of inputs and outputs. Furthermore, the linear nature of the data lines and decision units 106 of a fractal DAC 100 may result in fewer errors and/or less effect when errors, such as mistaken logical values, occur. Additionally, in some embodiments, each decision unit 106 of a fractal DAC 100 may have substantially the same components and/or dimensions, simplifying manufacturing. Moreover, one or more decision units 106 may be implemented while reducing or eliminating gate logic to further increase operating speed.

In some scenarios, the location of the decision units 106 within the array of unit cells 102 may increase the size the array. However, due at least in part to the reduced complexity of the control circuitry (e.g., the decision units 106 of the fractal DAC 100 of FIG. 6 compared to the control logic 118 of the column and line DAC 114 of FIG. 8), the internalization of the decision units 106 with the array of unit cells 102 may result in an overall smaller DAC 40 by reducing or eliminating control logic 118 exterior to the array of unit cells 102.

In addition to providing a simplified manufacturing, simplified operation, decreased size, and/or increased speed of operation, the fractal DAC 100 may include data paths (physically and/or logically) to each unit cell 102 that are substantially of the same dimensions, components, and/or number of components, which may further increase linearity and/or synchronicity. For example, returning briefly to FIG. 6, starting from the incoming digital signal 56 and the first decision unit 106A, the data path to each unit cell 102 and the number of decision units 106 traversed along the data path is the same for each unit cell 102. As should be appreciated, in some embodiments, some data paths of a fractal DAC 100 may differ due to manufacturing tolerances, physical layout constraints, and/or additional implementation factors.

On the contrary, other DACs, such as the column and line DAC 114 depicted in FIG. 8, may have shorter paths (e.g., data path 120) and longer paths (e.g., data path 122). In some scenarios, the disparate physical lengths and/or disparate logical circuitry traversed in a column and line DAC 114 may result in the column and line DAC 114 waiting until a specified time to allow for the control signals 116 to traverse the longer paths (e.g., data path 122). However, in some embodiments, a fractal DAC 100 may include data paths that are substantially the same, innately providing the decoded incoming signal 108 to each of the unit cells 102 concurrently or at substantially the same time. In other words, the substantially similar data paths of the fractal DAC 100 may reduce or eliminate a wait time associated with the difference between shorter and longer data paths (e.g., the difference between data path 120 and data path 122), further increasing the operable speed of the fractal DAC 100.

As discussed herein, when the digital signal 56 changes, calling for a different analog output signal 64, the activation signals at the unit cells 102 may change accordingly. Moreover, as the operating speed (e.g., operating frequency) of the DAC 40 increases, maintaining synchronicity with a reference clock signal (e.g., a local oscillator clock signal or latch clock signal, or other clock signal) may become more difficult. For example, it may be desirable that the changes to the activation signals occur while the reference clock signal is logically "low" to avoid potential errors. However, even with increased synchronicity due to the physical layout, such as that of a fractal DAC 100, it may be desirable to provide a data-clock alignment to ensure the changes to the activation signals occur while the reference clock signal is logically "low." Clock latches (e.g., for recapture) may be disposed at each unit cell 102 to provide alignment, but providing additional circuitry for each unit cell 102 may increase manufacturing costs and complexity as well as increase the overall size and/or power consumption of the unit cells 102 and DAC 40. However, in some embodiments, clock alignment circuitry may provide alignment without clock recapture at each unit cell 102, reducing the size and costs of the DAC 40. Moreover, the clock alignment circuitry may provide for a feedback loop to regulate alignment continuously or periodically to account for potential changes in operating conditions such as temperature or operating frequency.

Figure 9:
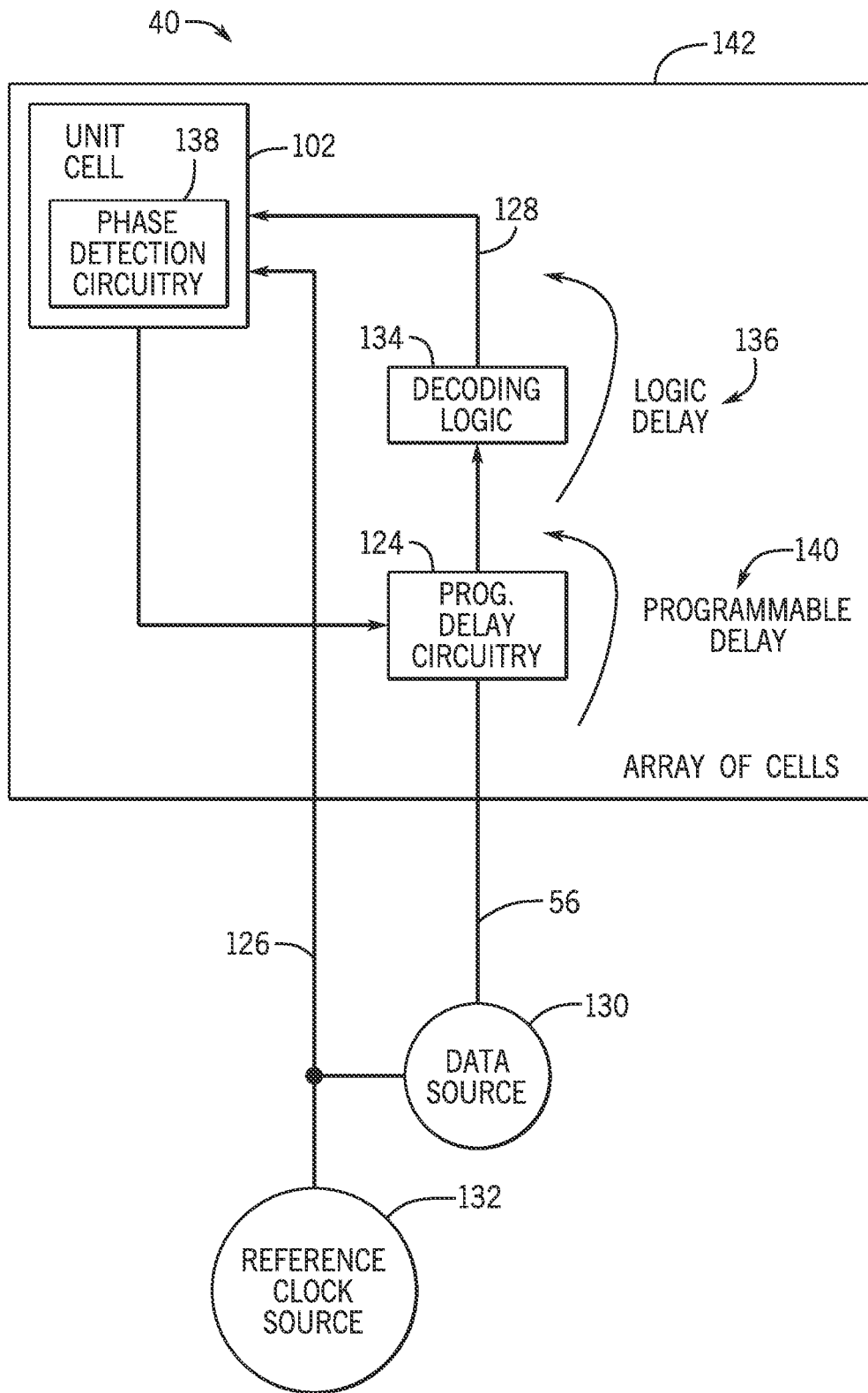
FIG. 9 is a schematic diagram of the digital-to-analog converter of FIG. 4 utilizing programmable delay circuitry, in accordance with an embodiment of the present disclosure.

To help illustrate, FIG. 9 is a schematic diagram of a DAC 40 (e.g., a fractal DAC 100) utilizing programmable delay circuitry 124 to provide clock alignment of a reference clock signal 126 and the activation signals 128 at the unit cells 102, according to an embodiment of the present disclosure. In general, a data source 130 may be clocked by the reference clock signal 126, generated by a reference clock source 132, prior to decoding of the digital signal 56 by decoding logic 134 (e.g., decision units 106 or control logic 118). The decoding logic 134 may cause a logic delay 136 to be experienced by the digital signal 56 as it is being decoded and distributed, as activation signals 128, to the unit cells 102. Clock alignment circuitry may include phase detection circuitry 138 and the programmable delay circuitry 124 to facilitate aligning the activation signals 128 with a particular state (e.g., logically "low") of the reference clock signal 126. For example, the phase detection circuitry 138 may be disposed at one or more unit cells 102 to receive and monitor the relative timing of the reference clock signal 126 and the activation signals 128 at the unit cells 102 (e.g., determine or detect phases of the reference clock signal 126 and the activation signals 128). Based on the monitored states at the unit cell 102 (e.g., receiving the phases of the reference clock signal 126 and the activation signals 128 from the phase detection circuitry 138), the programmable delay circuitry 124 may determine a delay amount (e.g., a programmable delay 140 to be applied to the digital signal 56 (e.g., prior to propagating through the decoding logic 134) such that the activation signal 128 arrives at the monitored unit cell(s) 102 at the desired time, such as when the reference clock signal 126 is logically "low." In some embodiments, the programmable delay circuitry 124 may include one or latches to recapture the digital signal 56 (e.g., according to a delayed clock signal generated by the programmable delay circuitry 124) to apply the programmable delay 140. Effectively, the logic delay 136 encountered by the digital signal 56 during processing and transmission to the unit cells 102 is measured, and the programmable delay 140 is added such that the total delay results in the decoded digital signal 56 (e.g., activation signal 128) arrives at the unit cell 102 while the reference clock signal 126 is in the desired state (e.g., logically "low").

In some embodiments, such as the fractal DAC 100 illustrated in FIG. 6, the logic delay 136 may be substantially similar for most or all of the unit cells 102, for example due to the substantially similar data paths of the digital signal 56. As such, the phase detection circuitry 138 may be disposed at a single unit cell 102 of the DAC 40 and provide alignment for multiple other unit cells 102. As should be appreciated, although one unit cell 102 is depicted in FIG. 9, the DAC 40 may include an array 142 of unit cells 102. Additionally or alternatively, multiple or all of the unit cells 102 may include the phase detection circuitry 138, and the programmable delay 140 may be based on the detected phase (e.g., relative time alignment between the delayed digital signal 56 (e.g., activation signal 128) and the reference clock signal 126) at the multiple unit cells 102. For example, if the detected phases range from first to last relative timings, the programmable delay 140 may be based on a single relative timing (e.g., the first or last relative timing) or an average of the relative timings. In other examples, programmable delays 140 may be generated for each unit cell 102, or groups of unit cells 102, based on the detected phase at that unit cell 102 or one of the group of unit cells 102.

Figure 10:
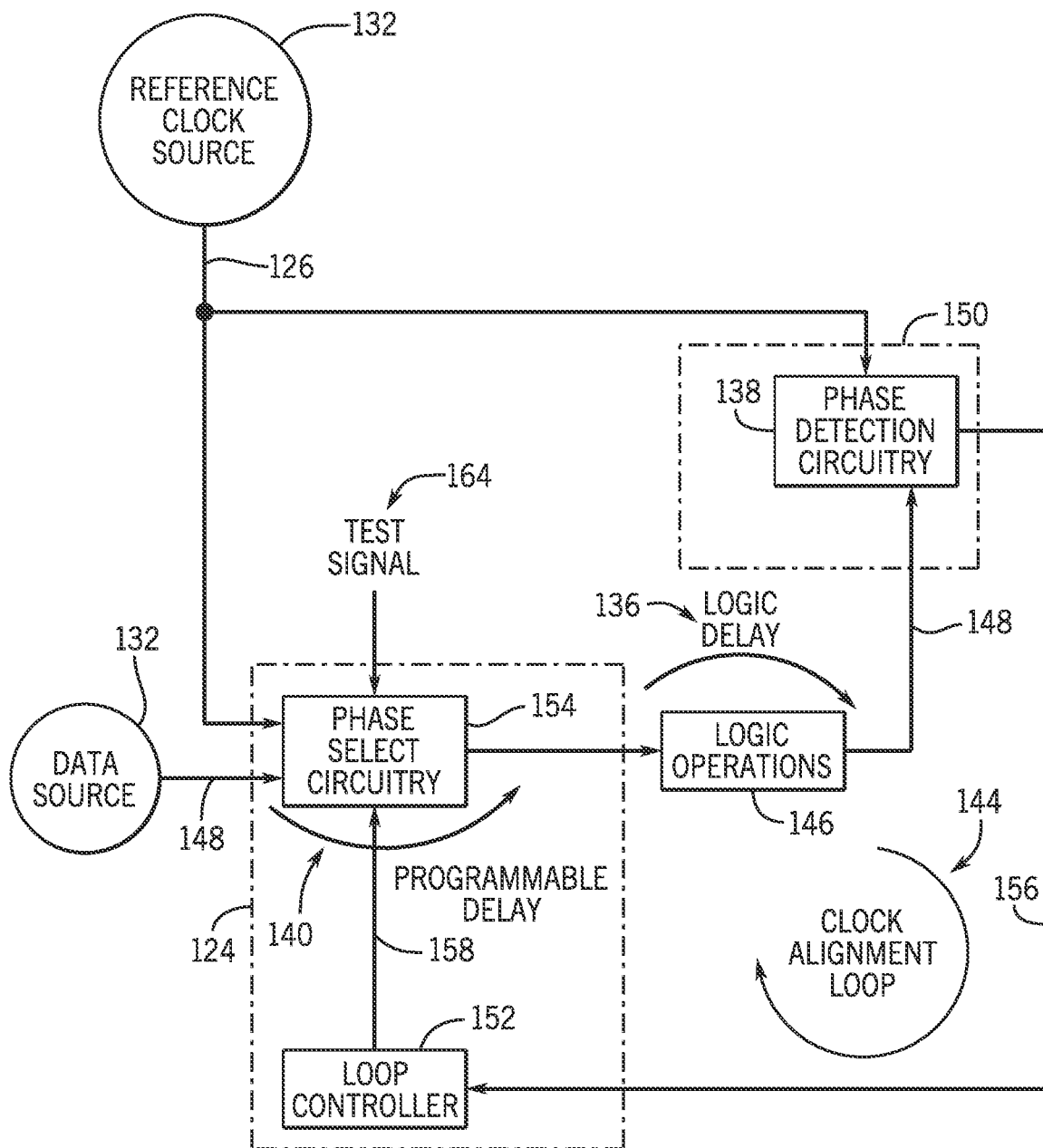
FIG. 10 is a schematic diagram of programmable delay circuitry and phase detection circuitry in a clock alignment loop, in accordance with an embodiment of the present disclosure.

While discussed herein as being utilized in a DAC 40 (e.g., fractal DAC 100, column and line DAC 114), it should be appreciated that the clock alignment circuitry may provide a clock alignment loop 144 providing the programmable delay 140 to adjust clock alignment according to the phase detected (e.g., by phase detection circuitry 138) downstream of the logic delay 136 of any suitable logic operations 146, as shown in FIG. 10. Indeed, the clock alignment loop 144 may provide for constant or periodic checking of the relative timing of the reference clock signal 126 and a data signal 148 (e.g., digital signal 56, activation signal 128, or any suitable signal encountering a logic delay 136) at a location of interest 150 (e.g., the unit cells 102 in the context of the DAC 40), and adjust the programmable delay accordingly. This may be particularly useful and beneficial when the logic delay 136 associated with the processing and transmission of the data signal 148 changes over time based on dynamic real-time changes, such as environmental (e.g., temperature, humidity, etc.) or operational (e.g., operating frequency, operating mode, voltage level, etc.) changes. In some embodiments, the programmable delay 140 may be updated following changes in environmental conditions, operating conditions, and/or changes in the reference clock signal 126, such as phase changes or resets, discussed further below.

To generate the programmable delay 140, the programmable delay circuitry 124 may include a loop controller 152 and phase select circuitry 154. In general, the loop controller 152 may receive a current alignment signal 156 indicative of the relative phases of the data signal 148 and the reference clock signal 126 at the location of interest 150. The loop controller 152 may then generate a phase select signal 158 based on the current alignment signal 156 to be used by the phase select circuitry 154 to set the programmable delay 140.

Figure 11:
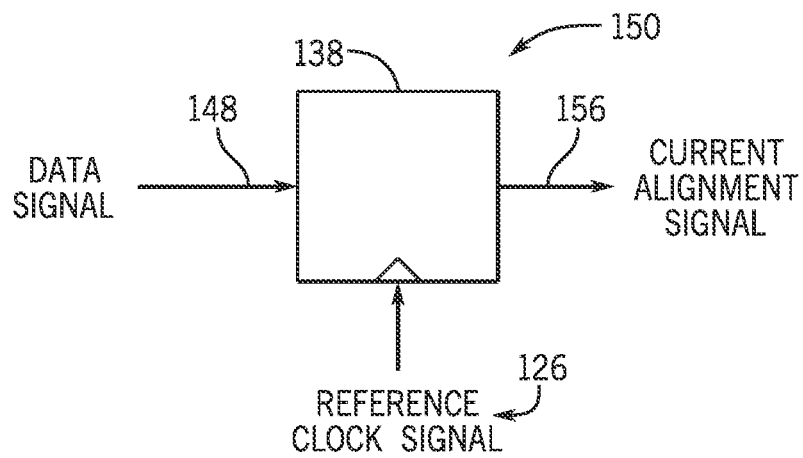
FIG. 11 is a schematic diagram of the phase detection circuitry of FIG. 10, in accordance with an embodiment of the present disclosure.
Figure 12:
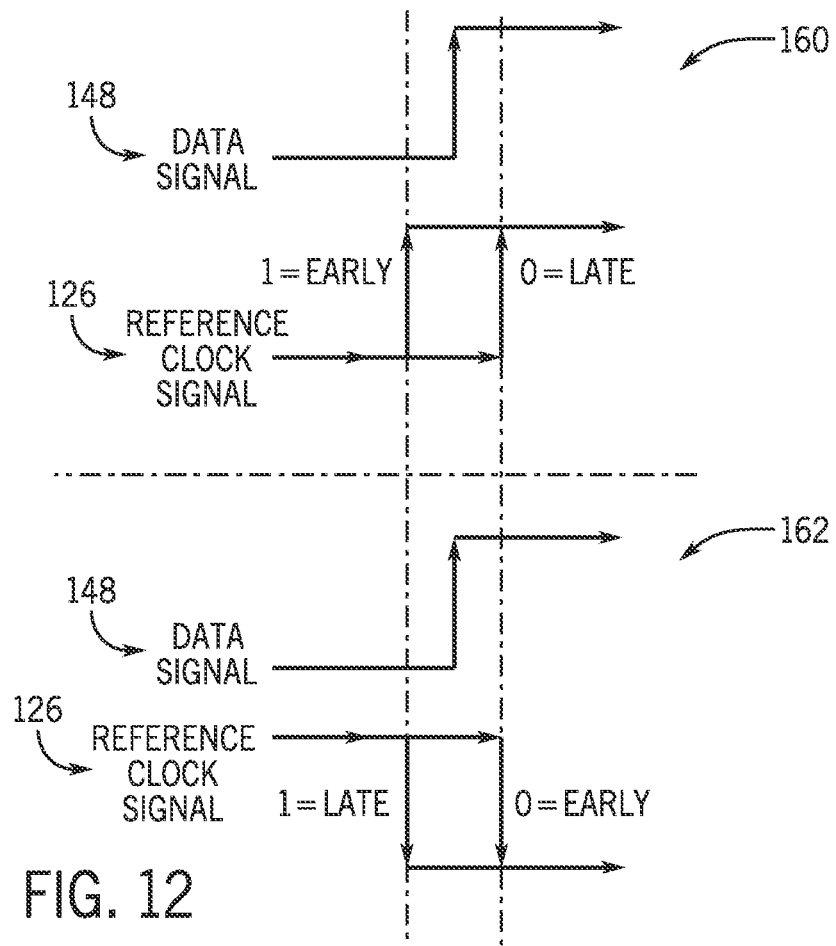
FIG. 12 is a pair of timing diagrams illustrating relative timings of a data signal and a reference clock signal, in accordance with an embodiment of the present disclosure.

To help illustrate, FIG. 11 is a schematic diagram of the phase detection circuitry 138, according to an embodiment of the present disclosure. In some embodiments, the phase detection circuitry 138 may include or altogether be a flip-flop (e.g., as illustrated) or other logical circuitry that determines whether the data signal 148 is "early" or "late" relative to the reference clock signal 126 at the location of interest 150. As should be appreciated, early and late are used as relative terms defining the relative timing of the data signal 148 and the reference clock signal 126. For example, when the data signal changes value (e.g., on a rising or falling edge), if the reference clock signal 126 is logically "high," then the data signal 148 may be considered early, and if the reference clock signal 126 is logically "low", the data signal 148 may be considered late, as shown in the timing diagrams 160 and 162 of FIG. 12. Moreover, the current alignment signal 156 may be based on the state of the data signal 148 when the reference clock signal 126 triggers the phase detection circuitry 138.

As discussed above, the toggling activity of the data signal 148 may be used to generate the current alignment signal 156. Additionally or alternatively, a test signal 164 may be generated by the phase select circuitry 154 or loop controller 152 and propagated down the data path of the data signal 148 to the phase detection circuitry 138. The test signal 164 may provide a known signal (e.g., having a known frequency) to facilitate identifying the early or late state of the data signal 148. In some embodiments, the test signal 164 may be equivalent to the reference clock signal 126, but propagated through the logic delay 136. Moreover, in some embodiments, the test signal 164 may have a dedicated data path with an equivalent logical delay 136 so as to not interrupt potential usage of the data signal 148.

Figure 13:
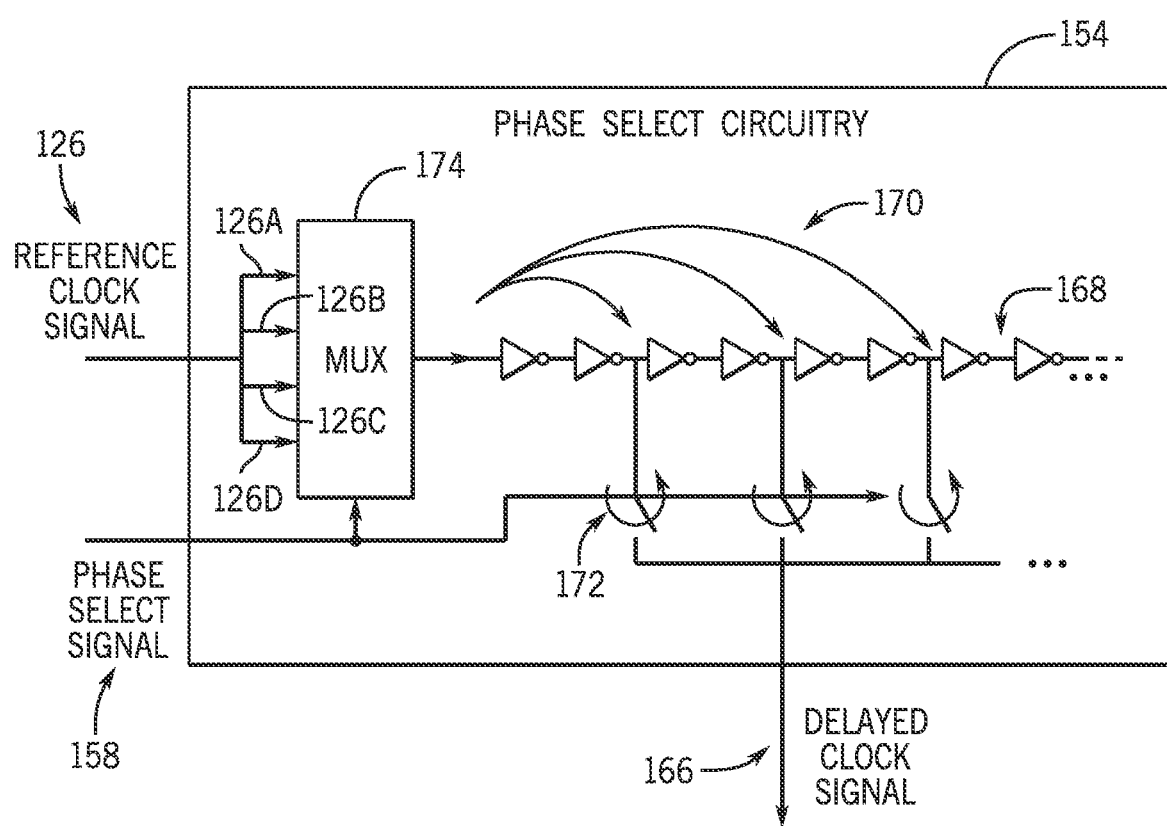
FIG. 13 is a schematic diagram of phase select circuitry, in accordance with an embodiment of the present disclosure.

Based on a single or multiple consecutive current alignment signals 156, the loop controller 152 may determine whether the data signal 148 is early or late and send the phase select signal 158 to the phase select circuitry 154 accordingly. The phase select circuitry 154 may receive the reference clock signal 126 and the phase select signal 158 and generate a delayed clock signal 166, as shown in FIG. 13. In some embodiments, the phase select circuitry 154 may include a string of buffers 168 (e.g., a series of inverter pairs) or other circuitry to provide an added delay 170 to the reference clock signal 126 without altering the frequency. Depending on the phase select signal 158, a point within the string of buffers 168 may be selected (e.g., via one or more switches 172), delaying the reference clock signal 126 to generate the delayed clock signal 166.

Additionally or alternatively, the reference clock signal 126 may include multiple different input clock signals 126A, 126B, 126C, and 126D with set phase differences (e.g., 15 degrees, 45 degrees, 90 degrees, 180 degrees, 270 degrees, and/or other phase differences from a base reference clock signal 126A) such as quadrature signals (e.g., a quadrature component signal, an in-phase component signal, an inverted quadrature component signal, and/or an inverted in-phase component signal). As such, the phase select circuitry 154 may select (e.g., via a multiplexer 174) one of the different reference clock signals 126A, 126B, 126C, and 126D and select (e.g., via the switches 172) the added delay 170 according to the phase select signal 158 such that the phase offset of the selected reference clock signal 126 combined with the added delay 170 is equivalent to the desired programmable delay 140. Moreover, the multiple different reference clock signals 126 may extend the programmability of the programmable delay 140 beyond the maximum added delay 170 of the string of buffers 168. In some embodiments, the reference clock signals 126 may be generated such that the phase select circuitry 154 selects (e.g., via the multiplexer 174) the delayed clock signal 166 directly from the different reference clock signals 126A, 126B, 126C, and 126D without an added delay 170. Moreover, while the reference clock signal 126 is shown as including four different clock signals, it should be appreciated that the reference clock signal 126 may include any number of different reference clock signals depending on implementation.

The delayed clock signal 166 may be used to gate, store, or recapture the data signal 148 (e.g., digital signal 56) before the logic operations 146 (e.g., including those of decoding logic 134) are performed, introducing the programmable delay 140 into the data signal 148. In some embodiments, the phase select circuitry 154 may operate directly on the data signal 148 instead of generating a delayed clock signal 166 to indirectly delay the data signal 148. For example, the data signal 148 may be propagated through the string of buffers 168 to effect the programmable delay 140 on the data signal 148.

Figure 14:
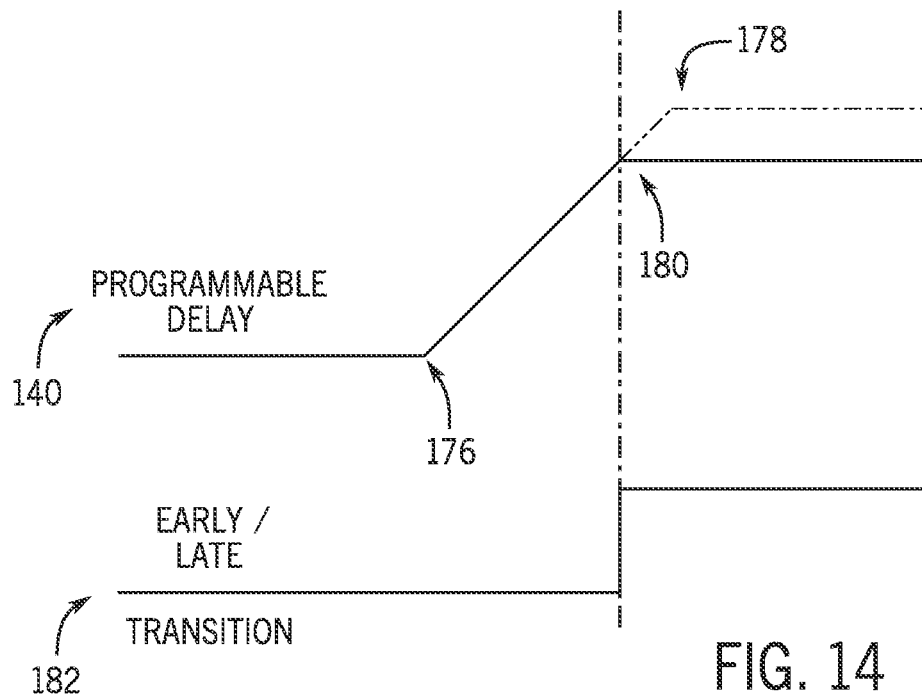
FIG. 14 is a graph of a programmable delay generated by the programmable delay circuitry of FIG. 10, in accordance with an embodiment of the present disclosure.

The loop controller 152 may select the programmable delay 140 from between a minimum delay 176 (e.g., as little as no delay) to a maximum delay 178 (e.g., up to a one clock cycle period), as shown in the graph of FIG. 14. In some embodiments, the loop controller 152 may steadily increase the programmable delay 140 in a ramp-up algorithm until alignment 180 is reached, as illustrated by the early/late transition 182 or trigger detected by the phase detection circuitry 138. The loop controller 152 may then maintain the programmable delay 140, as applied to the data signal 148, as shown in FIG. 10. In some embodiments, the loop controller 152 may continue with the ramp-up algorithm or other algorithm after the early/late transition 182 to detect and correct potential soft errors or metastability errors in the current alignment signal 156. Continuing the algorithm, at least momentarily, may provide more complete statistics to the loop controller 152 to determine the desired programmable delay 140.

Figure 15:
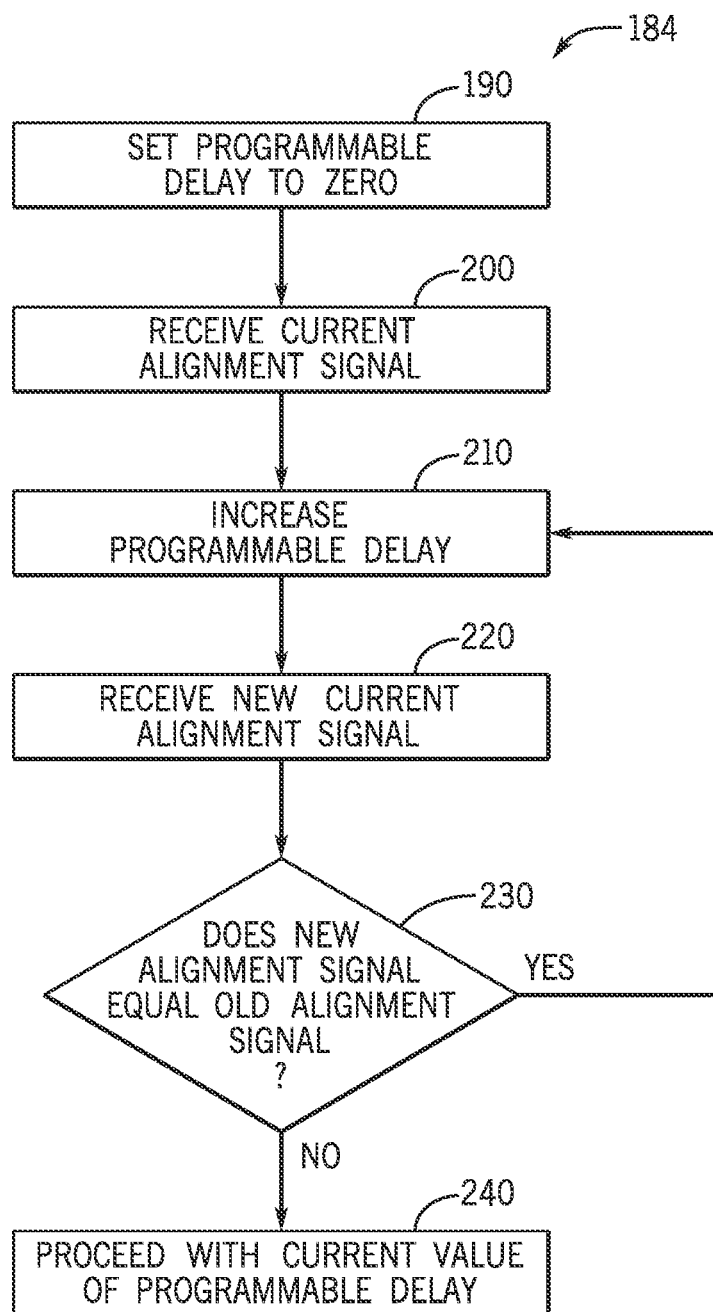
FIG. 15 is a flowchart for determining the programmable delay of FIG. 14, in accordance with an embodiment of the present disclosure.

FIG. 15 is an example flowchart 184 for determining the programmable delay 140 using the ramp-up algorithm, in accordance with an embodiment of the present disclosure. The loop controller 152 may initially start with a programmable delay 140 of zero (process block 190) and receive the current alignment signal 156 (process block 200). The loop controller 152 may then increase the programmable delay 140 (process block 210) and receive a new current alignment signal 156, taking into account the new programmable delay 140 (process block 220). The loop controller 152 may determine if the new alignment signal 156 is equal to the old alignment signal 156 (decision block 230). If the new alignment signal 156 is equal to or the same as the old alignment signal 156, the process may be repeated by increasing the programmable delay 140 (process block 210), receiving a new current alignment signal 156 (process block 220), and comparing the new and old alignment signals 156 (decision block 230). If the new alignment signal 156 is not equal to the old alignment signal 156, a change from early to late relative timings, or vice versa, may be indicative of alignment 180, and the loop controller 152 may proceed with the current value of the programmable delay 140 (process block 240). The loop controller 152 may then maintain the programmable delay 140, as applied to the data signal 148, as shown in FIG. 10.

Additionally or alternatively, the loop controller 152 may utilize an algorithm traversing only a subset of the available programmable delays 140 to determine and maintain alignment 180, such as a divide-and-conquer algorithm. For example, the loop controller 152 may implement the divide-and-conquer algorithm by beginning with zero programmable delay 140 and jumping to half of the maximum delay 178. If the new alignment signal 156 is not equal to the old alignment signal 156, it may indicate that alignment 180 is achieved at a programmable delay 140 between the minimum delay 176 (e.g., zero delay) and half of the maximum delay 178. As such, the loop controller 152 may then jump to a programmable delay 140 halfway between the minimum delay 176 and half of the maximum delay 178 and evaluate the alignment signals 156. As such, the loop controller 152 may continue dividing the potential programmable delays 140 until the alignment 180 is identified. In additional or alternative embodiments, the loop controller 152 may indicate that alignment 180 is achieved at a programmable delay 140 between half of the maximum delay 178 and the maximum delay 178, and, as such, the loop controller 152 may jump to a programmable delay 140 halfway between half of the maximum delay 178 and the maximum delay 178, evaluate the alignment signals 156, and continue dividing the programmable delay 140 until the alignment 180 is identified.

In some embodiments, the divide-and-conquer algorithm may be implemented using a bit-coordinated technique based on the phase select signal 158, derivation (e.g., portion, variation, etc.) thereof, or other indication of the currently requested programmable delay 140. For example, dividing the delay (e.g., jumping from no delay to half of the maximum delay 178 to 0.25 or 0.75 times the maximum delay 178) to try different amounts of the programmable delay 140 to find alignment 180 may be accomplished by consecutively processing a most significant bit of the phase select signal 158 or other bit-string followed by the next most significant bit and so on until all bits have been processed. In one embodiment, the phase select signal 158 may include a bit-string indicative of a numerical level of the programmable delay 140 such that a "1" for the most significant bit of the bit-string corresponds to a delay halfway between the minimum delay 176 and the maximum delay 178. Depending on if the loop controller 152 determines that alignment 180 is found between the minimum delay 176 and the halfway point or between the halfway point and the maximum delay 178, the loop controller may set/hold the most significant bit as a "0" or "1," respectively, and process the next most significant bit to determine the alignment 180 relative to quarter portions (e.g., 0.25 or 0.75 times) of the maximum delay 178. The process may continue with eighth portions with the third most significant bit and so on depending on the granularity (e.g., the bit-depth of the bit-string) of the implementation.

Furthermore, in some embodiments, different algorithms, such as the ramp-up algorithm and the divide-and-conquer algorithm, may be combined. For example, after identifying that alignment is within a certain range of programmable delays 140 using the divide-and-conquer algorithm, the ramp-up algorithm may be utilized within the range to determine which programmable is associated with alignment 180. As should be appreciated, in some embodiments, the programmable delay 140 may include a range of discrete values, and the programmable delay 140 associated with alignment 180 may be a closest approximation among the discrete values.

As stated above, in some embodiments, the programmable delay 140 may be updated following changes in the reference clock signal 126 such as phase changes or resets. Additionally, in some scenarios, changes in a clock signal, such as phase changes or resets during operation of the electronic device 10, may propagate glitches to circuitry reliant upon the clock signal. As used herein, glitches in the clock signal are defined as shortened clock cycles (e.g., clock pulses) that may cause undesired effects in subsequent circuitry. For example, a glitch in the clock signal may not allow a circuit component to finish operating before the shortened next clock cycle arrives, which may cause an unknown or error state in the circuit component. In some embodiments, clock change circuitry may reduce or eliminate glitches by holding a clock signal in a particular state (e.g., logically "low") while the clock change occurs and releases the clock signal afterwards, effectively skipping or reducing potentially glitched clock cycles.

Figure 16:
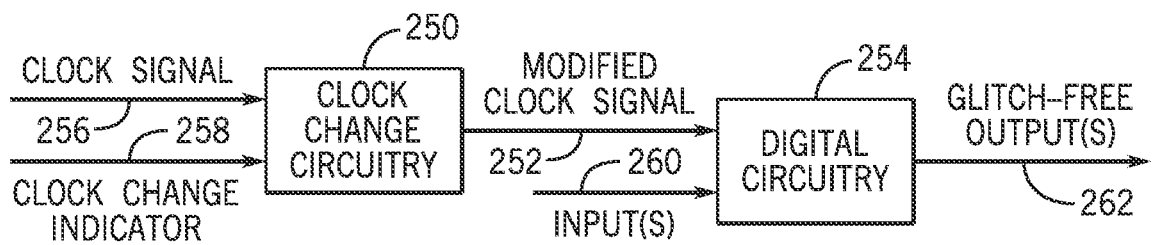
FIG. 16 is a block diagram of clock change circuitry providing a modified clock signal to digital circuitry, in accordance with an embodiment of the present disclosure.

To help illustrate, FIG. 16 is a block diagram of clock change circuitry 250 providing a modified (e.g., glitch-free) clock signal 252 to digital circuitry 254, in accordance with an embodiment of the present disclosure. In general, the clock change circuitry 250 may receive a clock signal 256 (e.g., from a clock generator) and a clock change indicator 258 indicative of impending or requested changes to the clock signal 256. Moreover, the digital circuitry 254 may receive the modified clock signal 252 as well as one or more inputs 260 to generate one or more glitch-free outputs. For example, when the clock change indicator 258 is toggled or triggered (e.g., by a controller such as the processor 12), the clock change circuitry 250 may blank out (e.g., hold logically "low") the modified clock signal 252 via a blanking command to avoid propagating glitches to the digital circuitry 254.

Figure 17:
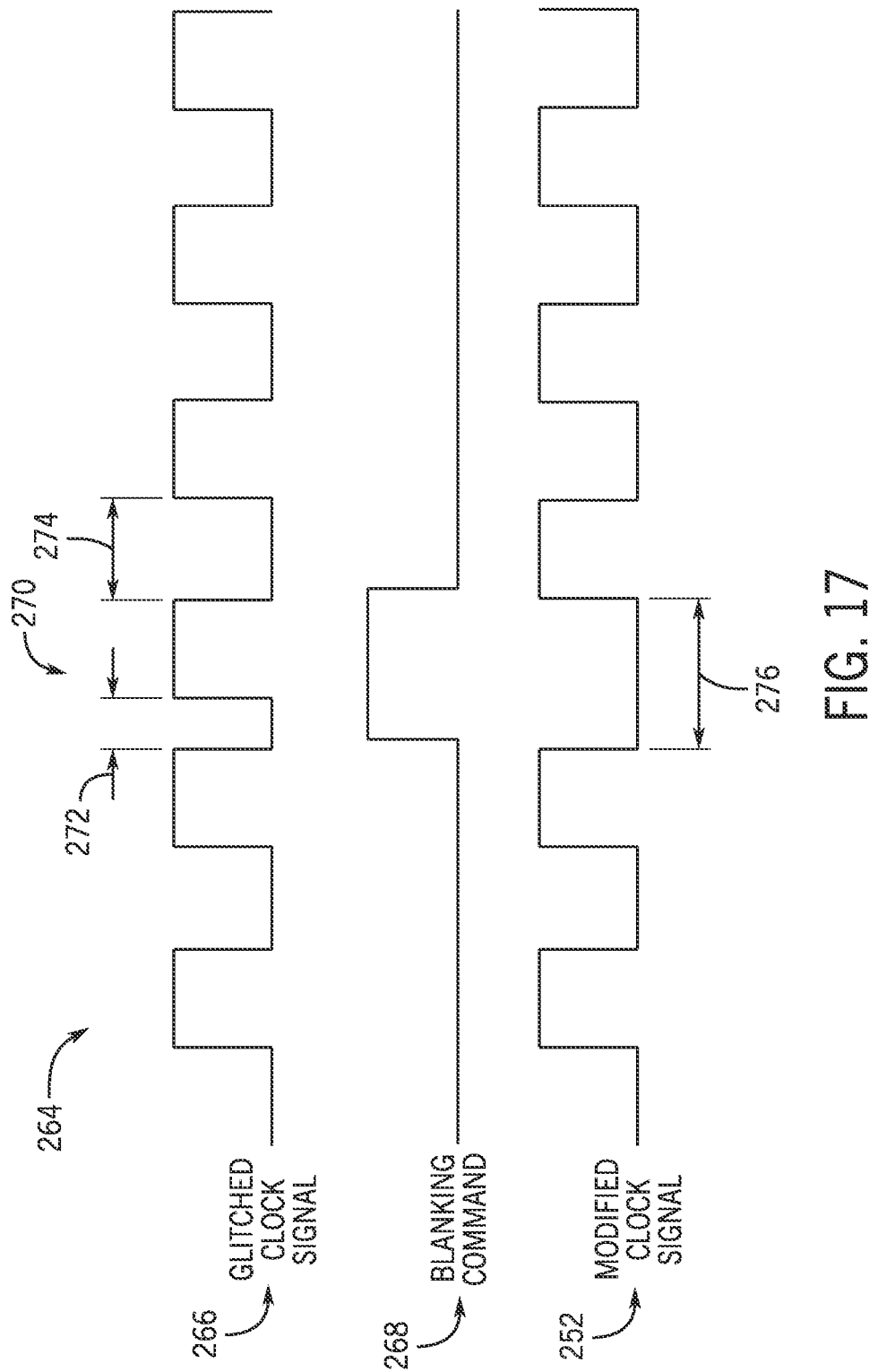
FIG. 17 is a set of timing diagrams illustrating the modified clock signal relative to a glitched clock signal, in accordance with an embodiment of the present disclosure.

FIG. 17 is a set of timing diagrams 264 illustrating the modified clock signal 252 relative to a glitched clock signal 266 and the blanking command 268 generated within the clock change circuitry 250, in accordance with an embodiment of the present disclosure. In some scenarios, if the clock signal 256 is unaltered during a phase change or reset, a glitch 270 may occur, causing a glitched clock signal 266. The glitch 270 may be indicative of a shortened clock pulse 272, relative to a normal clock pulse 274, which may cause errors in the digital circuitry 254 or subsequent circuitry. However, the clock change circuitry 250 may generate and utilize a blanking command 268 (e.g., prompted by the clock change indicator 258) to disable or hold constant the modified clock signal 252 logically "low" for an extended clock pulse 276, effectively skipping or removing the glitch 270.

Figure 18:
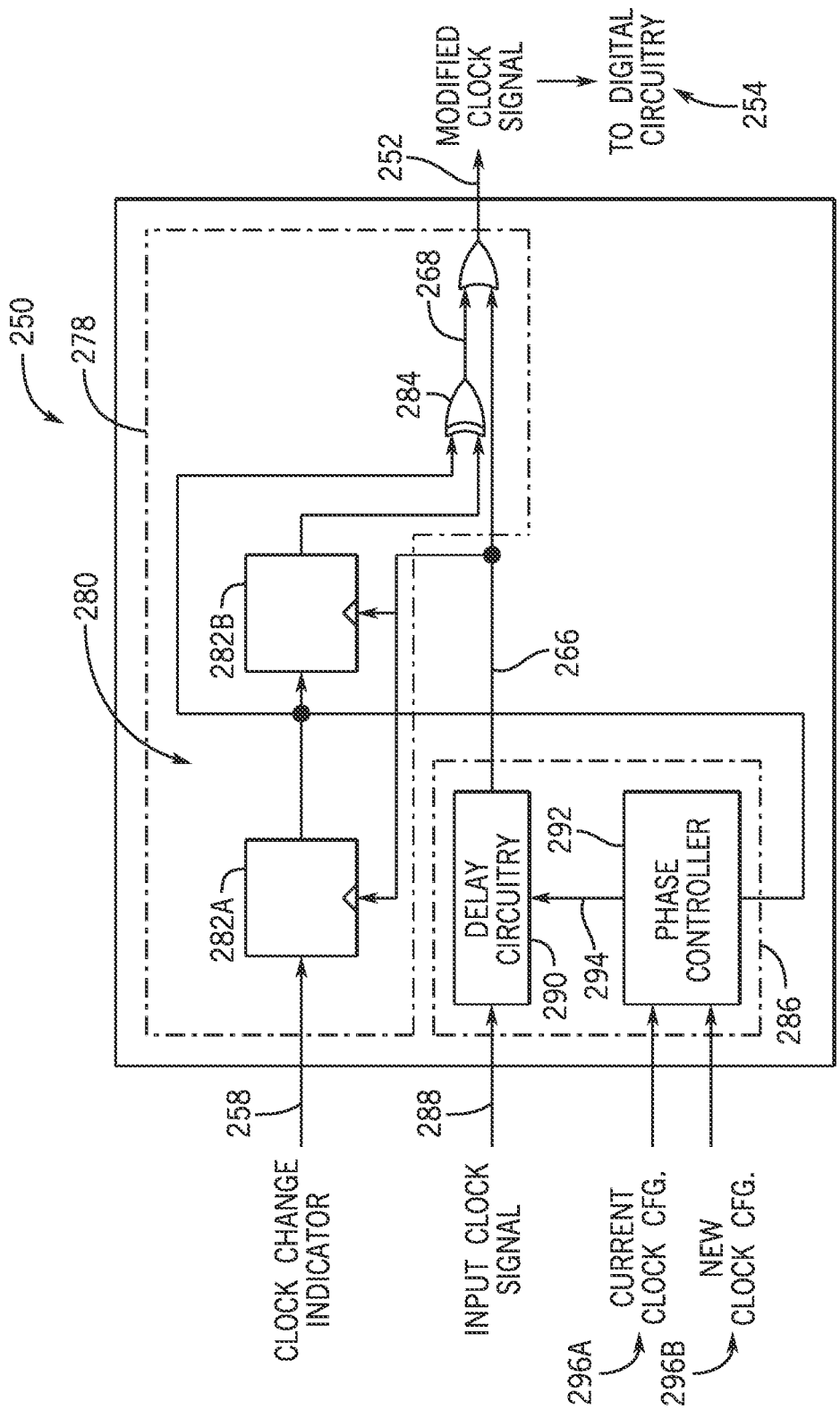
FIG. 18 is a schematic diagram of the clock change circuitry of FIG. 16, in accordance with an embodiment of the present disclosure.

In some embodiments, the blanking command 268 may be generated by blanking circuitry 278 and combined with the glitched clock signal 266 (e.g., via a logical OR gate) to generate the modified clock signal 252, as illustrated in FIG. 18. Additionally, the glitched clock signal 266 may be utilized to trigger state circuitry 280, such as a pair of flip flops 282A and 282B (cumulatively 282). The state circuitry 280 may receive the clock change indicator 258 and hold or store the activation of the clock change indicator 258 over multiple (e.g., the number of flip flops 282) clock cycles. The activated clock change indicator 258 maintained by the state circuitry 280 may be combined via a combination circuitry 284, such as a logical XOR gate, to generate the blanking command 268. In some scenarios, glitches 270 may occur multiple times during a single phase change/reset. As such, the state circuitry 280 may maintain the clock change indicator 258 for as long as glitches 270 are likely to occur. For example, the clock change indicator 258 may be provided to the state circuitry 280 for a longer period of time or additional flip-flops 282 may be utilized to maintain the clock change indicator 258 over additional clock cycles to extend the blanking command 268.

In some embodiments, it may be desirable to hold the modified clock signal 252 logically "low" while skipping the glitch 270 of the glitched clock signal 266. To ensure triggering at times when the clock signal 256 is logically "low," the state circuitry 280 may be triggered by the falling edge of the glitched clock signal 266 (e.g., via falling edge flip-flops 282). However, as should be appreciated, the desired polarity (e.g., logically "high" or "low" state or rising or falling clock edge) of the clock change indicator 258, the blanking command 268, glitched clock signal 266, the modified clock signal 252, or any other signal may be implementation dependent.

As stated above, glitches 270 may occur due to phase changes of the clock signal 256. In some embodiments, the clock change circuitry 250 may include phase change circuitry 286 to implement the change. For example, the phase change circuitry 286 may receive an input clock signal 288 (e.g., clock signal 256) and implement a delay, via delay circuitry 290 to alter the phase of the input clock signal 288. The delay of the delay circuitry 290 may be governed by a phase controller 292, such as a multiplexer. In some embodiments, the delay circuitry 290 may be similar to that of the phase select circuitry 154 of FIG. 13. For example, the phase controller 292 may send a phase control signal 294 to the delay circuitry 290 to select an amount of delay based on a clock configuration 296 (e.g., current clock configuration 296A or new clock configuration 296B (cumulatively 296)). Furthermore, in some embodiments, the input clock signal 288 may include multiple different input clock signals with set phase differences. For example, the input clock signal 288 may include a base clock signal and additional clock signals at different phases (e.g., 90 degrees, 180 degrees, 270 degrees, or other phase differences from the base clock signal). In some embodiments, the input clock signal 288 may include one or more quadrature signals (e.g., a quadrature component signal, an in-phase component signal, an inverted quadrature component signal, and/or an inverted in-phase component signal). As such, the phase controller 292 may select, via the phase control signal 294, from among the different input clock signals 288, and select the delay, if desired, according to the clock configuration 296. In some embodiments, utilizing input clock signals 288 with set phase differences may reduce the size or power consumption of the delay circuitry 290. For example, instead of utilizing a longer string of buffers (e.g., the string of buffers 168) to achieve a 275 degree phase offset, the delay circuitry 290 may be instructed by the phase controller 292 to start with an input clock signal 288 that already has a 270 degree phase offset and utilize a shorter string of buffers to add 5 degrees of offset, achieving the 275 degree offset with fewer buffers.

When a phase change is desired, the phase controller 292 may receive a new clock configuration 296B to implement instead of the current clock configuration 296A. Additionally, the state circuitry 280 may receive the clock change indicator 258. In the depicted embodiment, the phase controller 292 is triggered based on an intermediate state of the state circuitry 280 such that the phase change (e.g., the delay change from the current clock configuration 296A to the new clock configuration 296B) is triggered while the blanking circuitry 278 generates the blanking command 268. After the phase change has occurred, the state circuitry 280 may be triggered by the next falling edge of the glitched clock signal 266 (e.g., the falling edge of the clock cycle associated with the glitch 270), and the blanking command 268 may be released.

As should be appreciated, the blanking circuitry 278 may be implemented separately from and/or without the phase change circuitry 286. For example, the input clock signal 288 (e.g. clock signal 256) may be the glitched clock signal 266. Furthermore, although discussed above with regard to phase changes applied by the delay circuitry 290, the clock change circuitry 250 may also reduce or eliminate glitches 270 associated with clock resets. For example, if the input clock signal 288 is reset, a glitch 270 may occur. As such, the blanking circuitry 278 may receive the clock change indicator 258 in anticipation of the reset, and provide the blanking command 268 during the reset to avoid or reduce potential glitches 270.

Figure 19:
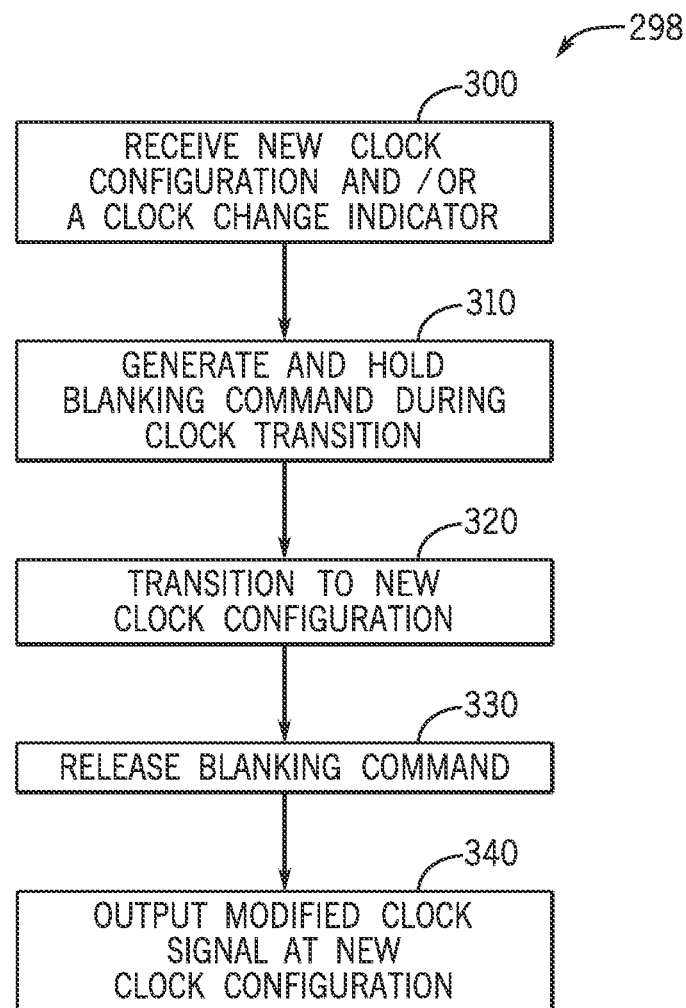
FIG. 19 is a flowchart of the operation of the clock change circuitry of FIG. 16, in accordance with an embodiment of the present disclosure.

FIG. 19 is a flowchart 298 of the operation of the clock change circuitry of FIG. 16, in accordance with an embodiment of the present disclosure. In some embodiments, the clock change circuitry 250 may receive a new clock configuration signal 296B and/or a clock change indicator 258 (process block 300). For example, if the clock change circuitry 250 includes phase change circuitry 286, the new phase change circuitry 286 may use the new clock configuration 296B to adjust the phase of the input clock signal 288. The clock change circuitry may also generate and hold a blanking command 268 while the clock transitions from the current clock configuration 296A to the new clock configuration 296B (process block 310). The input clock signal 288 may be then be transitioned to the new clock configuration 296B (process block 320), for example, via the delay circuitry 290. After the transition, the blanking command 268 may be released (process block 330), and the modified clock signal 252 may be output with the new clock configuration 296B (process block 340).

As stated above with regard to the programmable delay circuitry 124, the phase select circuitry may change the phase of the reference clock signal 126 to generate the delayed clock signal 166. In some scenarios, such phase changes may introduce glitches 270 into the delayed clock signal 166 which may propagate to the decoding logic 134 or the digital signal 56. As such, in some embodiments, the phase select circuitry 154 may be considered the delay circuitry 290 of the phase change circuitry 250, and vice versa, and the loop controller 152 may include the phase controller 292. Indeed, some embodiments of the clock alignment circuitry (e.g., the programmable delay circuitry 124) may be integrated with the clock change circuitry 250. For example, clock configurations 296 may be predetermined (e.g., based on environmental factors and/or operating mode) to account for the logic delay 136 and achieve alignment 180, supplementing or supplanting the phase detection circuitry 138. Additionally or alternatively, the current alignment signal 156 may be utilized by the phase controller 292 and/or loop controller 152, supplementing or supplanting the clock configuration 296, to control the programmable delay 140 of the phase select circuitry 154.

As should be appreciated, components of the disclosed embodiments such as but not limited to the processor 12, decoding logic 134, phase detection circuitry 138, phase select circuitry 154, loop controller 152, logic operations 146, data source 132, reference clock source 132, digital circuitry 254, delay circuitry 290, phase controller 292, clock change circuitry 250, blanking circuitry 280, and/or any digital logic components (e.g., AND gates, OR gates, XOR gates, etc.) may be considered processing circuitry. Moreover, components may be implemented together or separately and, although discussed individually, may or may not have physical or logical separations between them. Additionally, although the above referenced flowcharts and are shown in a given order, in certain embodiments, process blocks may be reordered, altered, deleted, and/or occur simultaneously. Additionally, the referenced flowcharts and are given as illustrative tools and further decision and process blocks may also be added depending on implementation. Furthermore, while signals discussed herein have been discussed as logically "high" or "low" and rising or falling, it should be appreciated that such signals are given as non-limiting examples, and alternative logic may be used that utilizes the opposite or different logical signals.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device comprising:
   a plurality of cells;
   decoding logic coupled to the plurality of cells and configured to receive a digital signal and to output the digital signal to a cell of the plurality of cells with a time delay, the plurality of cells and the decoding logic forming, at least in part, a digital-to-analog converter (DAC);
   phase detection circuitry comprising a flip-flop configured to receive a reference clock signal and the digital signal after the time delay and to output an alignment signal; and
   programmable delay circuitry configured to receive the alignment signal and delay the digital signal by a programmable delay, before the time delay, based at least in part on the alignment signal.

2. The electronic device of claim 1, wherein the programmable delay circuitry comprises phase select circuitry having a series of buffers.

3. The electronic device of claim 2, wherein the programmable delay circuitry comprises a loop controller configured to select the programmable delay by enabling a switch of a plurality of switches, wherein each of the plurality of switches is associated with a different number of buffers of the series of buffers.

4. The electronic device of claim 3, wherein the loop controller is configured to iteratively apply different values of the programmable delay until an alignment of the reference clock signal and the digital signal is determined.

5. The electronic device of claim 1, wherein the programmable delay circuitry comprises a multiplexer configured to receive a plurality of clock signals and select a clock signal of the plurality of clock signals based at least in part on the alignment signal, wherein each respective clock signal of the plurality of clock signals comprises a respective phase offset relative to the reference clock signal, wherein the programmable delay is based at least in part on the respective phase offset of the selected clock signal.

6. The electronic device of claim 5, wherein the programmable delay circuitry comprises a series of buffers configured to add a selectable additional delay to the selected clock signal based at least in part on the alignment signal to generate a delayed clock signal, wherein the programmable delay circuitry is configured to delay the digital signal by the programmable delay by recapturing the digital signal based at least in part on the delayed clock signal.

7. The electronic device of claim 1, wherein the programmable delay circuitry is configured to apply the programmable delay to the digital signal such that a change in the digital signal is received at the cell while the reference clock signal is in a particular state.

8. The electronic device of claim 1, wherein the DAC comprises a fractal DAC having a branching distribution tree configured to distribute decoded portions of the digital signal to the plurality of cells, wherein the branching distribution tree comprises the decoding logic.

9. The electronic device of claim 1, wherein the alignment signal is associated with a relative timing between the reference clock signal and the digital signal received at the cell.

10. A method comprising:
    receiving, at processing circuitry of a clock alignment loop, a first alignment signal indicative of a first timing difference between a reference clock signal and a data signal at a circuit of interest;
    changing, via the processing circuitry, a programmable time delay of the data signal;
    receiving, at the processing circuitry, a second alignment signal indicative of a second timing difference between the reference clock signal and the data signal at the circuit of interest, the second timing difference based at least in part on the programmable time delay;
    comparing, via the processing circuitry, the first alignment signal and the second alignment signal; and
    aligning the reference clock signal and the data signal at the circuit of interest via an aligned value of the programmable time delay based at least in part on comparing of the first alignment signal and the second alignment signal.

11. The method of claim 10, wherein a data path of the data signal comprises digital logic coupled to the circuit of interest, wherein the data signal encounters a time delay based at least in part on the digital logic, wherein the processing circuitry is configured to apply the programmable time delay to the data signal prior to the data signal being received by the digital logic to align the reference clock signal and the data signal at the circuit of interest based at least in part on a combined delay of the time delay and the programmable time delay.

12. The method of claim 11, wherein the circuit of interest comprises a unit cell of a digital-to-analog converter (DAC), the data signal comprises an activation signal of the unit cell, and the digital logic comprises decoding logic of the DAC.

13. The method of claim 10, comprising iteratively changing the programmable time delay, receiving a plurality of relative timings corresponding to one or more iteratively changed programmable time delays, and comparing subsequent relative timings of the plurality of relative timings to determine the aligned value of the programmable time delay.

14. The method of claim 13, wherein iteratively changing the programmable time delay, receiving the plurality of relative timings, and comparing the subsequent relative timings to determine the aligned value of the programmable time delay are performed using a divide-and-conquer algorithm.

15. The method of claim 10, wherein the circuit of interest comprises phase detection circuitry configured to generate the first alignment signal and the second alignment signal.

16. An electronic device comprising:
   first logic circuitry comprising a logic input configured to receive a data signal and a logic output configured to output a processed data signal to second logic circuitry, the first logic circuitry causing a first delay between the logic input and the logic output;
   the second logic circuitry comprising phase detection circuitry configured to receive the processed data signal, receive a reference clock signal, and output an alignment signal associated with a relative timing between the reference clock signal and the processed data signal;
   phase select circuitry comprising a string of buffers configured to effect a second delay on the data signal based at least in part on a number of buffers implemented in the string of buffers; and
   a loop controller configured to select the number of buffers to implement in the string of buffers based at least in part on the alignment signal.

17. The electronic device of claim 16, wherein the loop controller is configured to determine the second delay such that a change in the processed data signal is received at the second logic circuitry while the reference clock signal is in a particular state.

18. The electronic device of claim 16, wherein the string of buffers is configured to delay a second reference clock signal to generate a delayed clock signal, wherein the data signal is gated based at least in part on the delayed clock signal, effecting the second delay on the data signal.

19. The electronic device of claim 16, wherein the data signal comprises a test signal generated by the loop controller.

20. The electronic device of claim 16, wherein the first logic circuitry comprises decoding circuitry of a digital-to-analog converter (DAC), the data signal comprises a digital signal corresponding to an analog output signal of the DAC, the second logic circuitry comprises a unit cell of a plurality of unit cells of the DAC, and the processed data signal comprises an activation signal of the unit cell.

* * * * *